United States Patent
Possin et al.

(10) Patent No.: US 7,307,301 B2
(45) Date of Patent: Dec. 11, 2007

(54) IMAGING ARRAY

(75) Inventors: George Edward Possin, Niskayuna, NY (US); Robert F. Kwasnick, Palo Alto, CA (US); Douglas Albagli, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 49 days.

(21) Appl. No.: 10/322,117

(22) Filed: Dec. 17, 2002

(65) Prior Publication Data
US 2004/0115857 A1 Jun. 17, 2004

(51) Int. Cl.
*H01L 31/062* (2006.01)
(52) U.S. Cl. ...................................... 257/292
(58) Field of Classification Search ............... None
See application file for complete search history.

(56) References Cited
U.S. PATENT DOCUMENTS

| 5,435,608 A | 7/1995 | Wei et al. |
| 5,463,232 A | 10/1995 | Yamashita et al. |
| 5,480,810 A | 1/1996 | Wei et al. |
| 5,517,031 A | 5/1996 | Wei et al. |
| 5,838,054 A | 11/1998 | Kwasnick et al. |
| 6,031,248 A | 2/2000 | Mei et al. |
| 6,066,883 A | 5/2000 | Hosier et al. |
| 6,078,366 A * | 6/2000 | Dohjo et al. .................. 349/43 |
| 6,239,470 B1 | 5/2001 | Yamazaki |
| 6,396,046 B1 * | 5/2002 | Possin et al. ............ 250/208.1 |
| 6,714,266 B1 * | 3/2004 | Ueda et al. ................... 349/38 |

FOREIGN PATENT DOCUMENTS

| FR | 0314449 | 4/2006 |
| JP | 09275202 | 10/1997 |

OTHER PUBLICATIONS

Ryu et al, "A Novel Amorphous Silicon Photoconductor Array," Journal of the Korean Physical Society, Dec. 2001, 39:S264-S267.

* cited by examiner

*Primary Examiner*—Kiesha Rose
(74) *Attorney, Agent, or Firm*—Armstrong Teasdale LLP

(57) ABSTRACT

A method for fabricating an imaging array includes forming a first dielectric barrier, forming a light block element on the first dielectric barrier, wherein the light block element is at least coextensive with a gate, and forming a second dielectric barrier on the first dielectric barrier and the light block element such that the light block element is encapsulated between the first dielectric barrier and the second dielectric barrier.

9 Claims, 8 Drawing Sheets

US 7,307,301 B2

IMAGING ARRAY

STATEMENT REGARDING FEDERALLY SPONSORED RESEARCH & DEVELOPMENT

The government may have rights in this invention pursuant to National Institutes of Standards and Technology (NIST) Contract No. 70NANB5HK009.

BACKGROUND OF THE INVENTION

This invention relates generally to imaging arrays, and more particularly, to pixel formations for imaging arrays.

Imaging arrays for detecting x-rays typically include a photosensor array coupled to a scintillating medium. Radiation absorbed in the scintillator generates optical photons which in turn pass into a photosensor, such as a photodiode. The photon is absorbed in the photosensor and an electrical signal corresponding to an incident photon flux is generated. Hydrogenated amorphous silicon (a-Si:H) is commonly used in the fabrication of photosensors due to advantageous photoelectric characteristics of a-Si:H and a relative ease of fabricating such devices. In particular, a plurality of photosensitive elements, such as photodiodes, can be formed in connection with any necessary control or switching elements, such as a thin film transistor (TFT), in a relatively large array. Radiation detectors and display arrays are typically fabricated on a large substrate on which many components, including TFTs, address lines, capacitors, and devices such as photosensors, are formed through the deposition and patterning of layers of conductive, semiconductive, and insulative materials.

At least one known fabrication process for such a TFT array typically includes fabricating a bottom gate TFT and a plurality of data and scan address lines. In some known bottom gate TFTs, the bottom gate metal shields a channel region, i.e. acts as a light blocking element, blocking light from a back light. The light blocking layer is desirable since photons can create an undesirable leakage in the TFT. For example, in a digital x-ray panel, the light is created from a scintillator that is deposited on the top of the devices which directly exposes the TFT regions to photons. Therefore, an additional light blocking layer, requiring an additional photolithography level, is therefore necessary to shield the TFT channel region from undesirable light.

BRIEF DESCRIPTION OF THE INVENTION

In one aspect, a method for fabricating an imaging array is provided. The method includes forming a first dielectric barrier, forming a light block element on the first dielectric barrier, wherein the light block element is at least coextensive with a gate, and forming a second dielectric barrier on the first dielectric barrier and the light block element such that the light block element is encapsulated between the first dielectric barrier and the second dielectric barrier.

In another aspect, an imaging array is provided. The imaging array includes a first dielectric barrier, a light block element formed on the first dielectric barrier, wherein the light block element is at least coextensive with a gate electrode, and a second dielectric barrier formed on the first dielectric barrier and the light block element such that the light block element is encapsulated between the first dielectric barrier and the second dielectric barrier.

In a further aspect, a medical imaging system is provided. The medical imaging system includes a radiation source, and a radiation detector operationally coupled to the radiation source. The radiation detector includes a first dielectric barrier, a light block element formed on the first dielectric barrier, wherein the light block element is at least coextensive with a gate electrode, and a second dielectric barrier formed on the first dielectric barrier and the light block element such that the light block element is encapsulated between the first dielectric barrier and the second dielectric barrier.

DETAILED DESCRIPTION OF THE INVENTION

Figure 1:
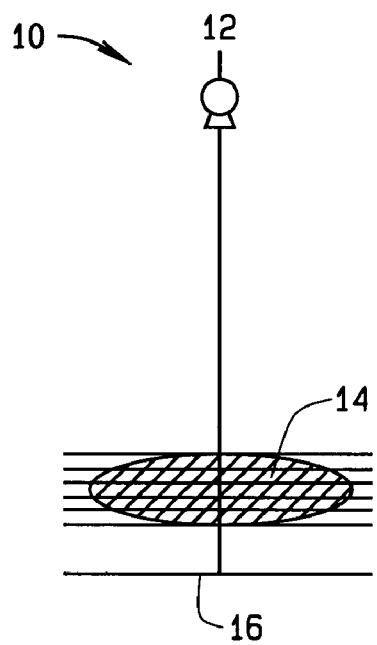
FIG. 1 is a pictorial view of a prior art imaging system.

FIG. 1 is a pictorial view of a known imaging system 10. In one embodiment imaging system 10 is a medical imaging system, such as, but not limited to, a Sennovision 2000D which is commercially available from GE Medical Systems, Milwaukee, Wis. Imaging system 10 includes a radiation source 12 which projects a cone-shaped beam. In one embodiment, radiation source 12 is an x-ray source 12, and the cone-shaped beam is an x-ray beam. The x-ray beam passes through an object 14, i.e. an object being imaged such as a patient. The x-ray beam, after being attenuated by object 14, impinges upon radiation detector 16.

Figure 2:
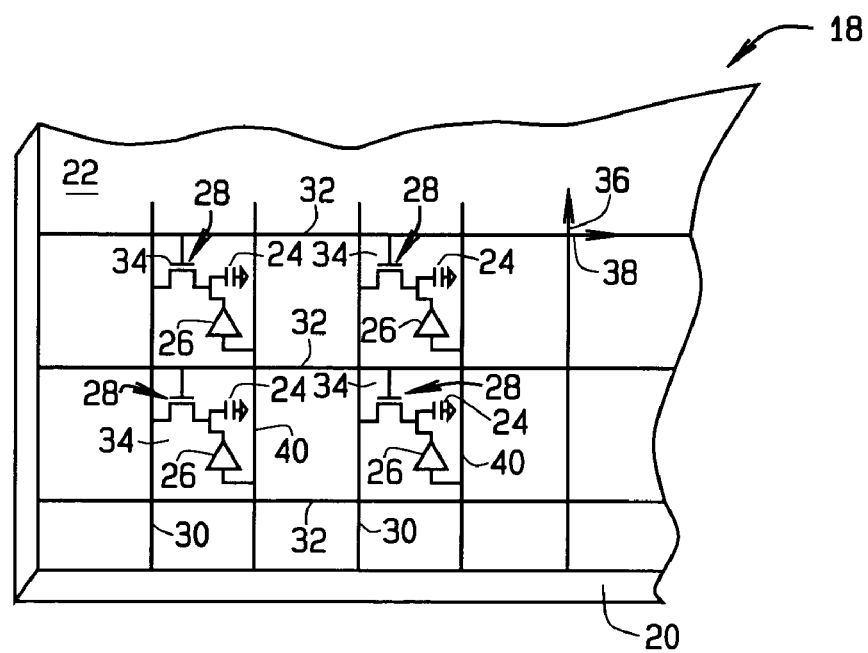
FIG. 2 is schematic illustration of a representative pixel in a photosensor array.

FIG. 2 is a radiation detector 18 that may be used with imaging system 10 (shown in FIG. 1). Radiation detector 18 includes a substrate 20 on which a pixel array 22 (sometimes called a photosensor array) is disposed. In one embodiment, photosensor array 22 includes a plurality of electronic components, such as capacitors 24, photodiodes 26, and switching devices 28, such as TFTs. TFTs 28 are disposed on array 22 to selectively couple a respective capacitor 24 and photodiode 26 to a respective data line 30. In another embodiment, photosensor array 22 does not include capacitor 24. Photosensor array 22 also includes a plurality of scan lines 32 for addressing a plurality of individual pixels 34. Data lines 30 are oriented along a first axis 36 of pixel array 22, and scan lines 32 are oriented along a second axis 38 of pixel array 22. First and second axes, 36 and 38, of pixel array 22, are disposed substantially perpendicular to each other.

For ease of illustration in FIG. 2, only a few of data lines 30, scan lines 32, and common lines 40 are shown extending across photosensor array 22. Data lines 30, scan lines 32, and common lines 40 are arranged in rows and columns such that individual pixels 34 in photosensor array 22 are addressable by one data line 30, one scan line 32, and one common line 40. Data lines 30, scan lines 32, and common lines 40 include a conductive material, such as molybdenum, chromium, and/or aluminum. Capacitors 24 are electrically parallel connected to photodiodes 26, and are electrically coupled to data lines 30 through TFTs 28. Photodiodes 26 form the portion of array 22 that is responsive to incident photons and produce electric charge corresponding to a detected incident light. X-ray energy is converted to visible light energy by absorption in a layer of phosphor (not shown), such as cesium iodide, which is disposed near the surface of photosensor array 22. Capacitors 24 store a charge generated in photodiode 26 and discharge this stored charge through TFT 28 when scan line 32 is addressed. Some charge is also stored on the self-capacitance of photodiode 26.

Figure 3:
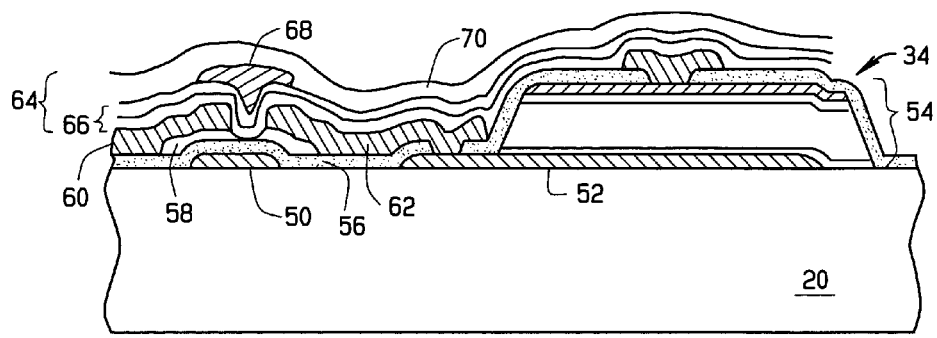
FIG. 3 is a cross-sectional view of a portion of a pixel of a radiation detector.
Figure 4:
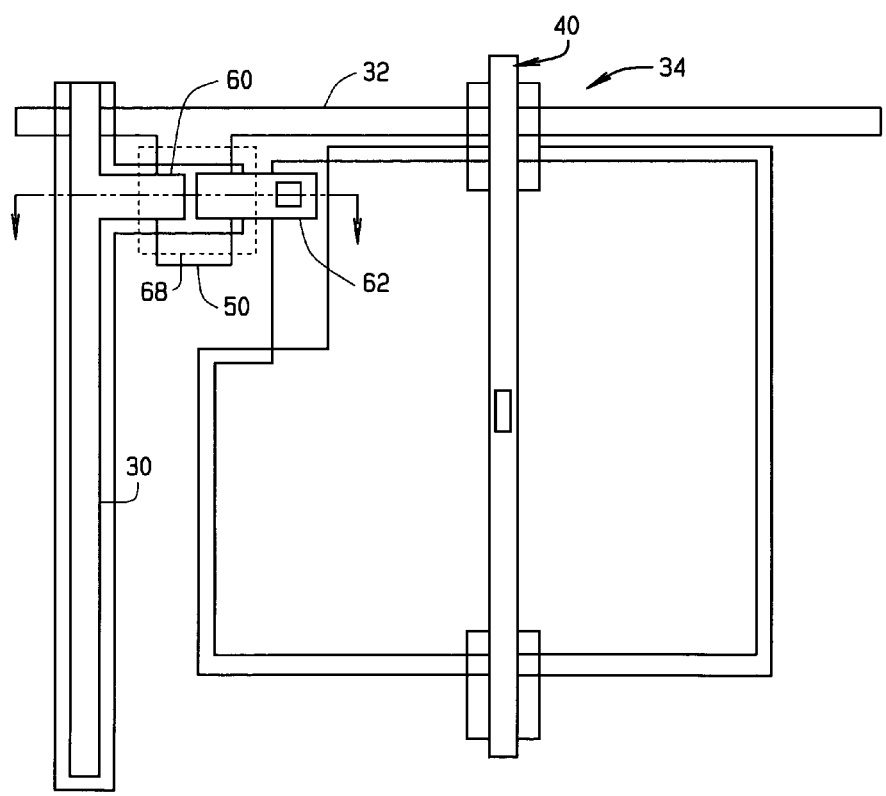
FIG. 4 is a top view of a portion of the pixel shown in FIG. 3.

FIG. 3 is a cross-sectional view of a portion of pixel 34 formed on substrate 20. FIG. 4 is a top view of a portion of pixel 34 shown in FIG. 3. As used herein, "formed" includes processes to fabricate each component of pixel 34, including, but not limited to, patterning, masking, depositing, and etching. In an exemplary embodiment, all semiconductive layers and dielectric layers described herein are deposited by plasma enhanced chemical vapor deposition (PECVD). Pixel 34 includes a TFT gate electrode 50 and a diode bottom contact 52 extending over a surface of substrate 20 such that gate electrode 50 and diode bottom contact 52 are approximately equal in thickness. Pixel 34 also includes a diode stack 54 formed on diode bottom contact 52. In one embodiment, diode stack 54 includes a PIN diode. A PIN diode includes a layer of p+ material deposited on a layer of substantially intrinsic a-Si which is deposited on a layer of n+ material. In one embodiment, a diode top contact (not shown) is deposited, patterned, and etched on diode stack 54. In an alternative embodiment, the diode top contact is not formed. A gate dielectric layer 56 is then formed on exposed portions of gate electrode 50, diode bottom contact 52, and diode stack 54. A semiconductor layer 58 is then deposited on dielectric layer 56. After patterning and etching gate dielectric layer 56 and semiconductor layer 58, a source electrode 60 and a drain electrode 62 are then deposited, masked and etched. Pixel 34 also includes a light transmissive barrier layer 64 that includes a first dielectric barrier 66, a light block element 68 and a second dielectric barrier 70. First dielectric barrier 66 is formed on exposed portions of source electrode 60, drain electrode 62, and dielectric layer 56. Light block element 68 is then formed on first dielectric barrier 66 followed by second dielectric barrier 70. In the exemplary embodiment, light block element 68 is at least coextensive with gate electrode 50 and second dielectric barrier 70 is formed on first dielectric barrier 66 and light block element 68 such that light block element 68 is encapsulated between first dielectric barrier 66 and second dielectric barrier 70. The imaging array is then coupled to a scintillator and the scintillator is sealed. The imaging is array is then connected to a plurality of external contacts to form detector 18 which can be used in imaging system 10.

Figure 5:
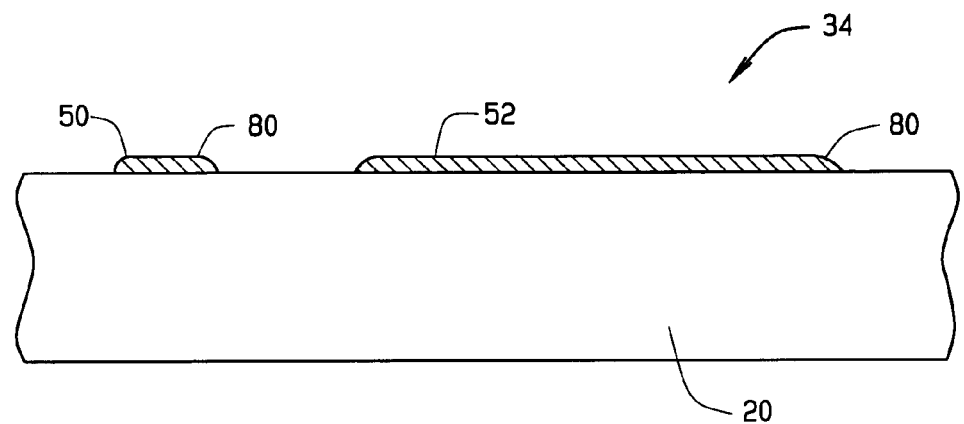
FIG. 5 is a cross-sectional view of a portion of the pixel shown in FIG. 3 during an initial fabrication stage.
Figure 6:
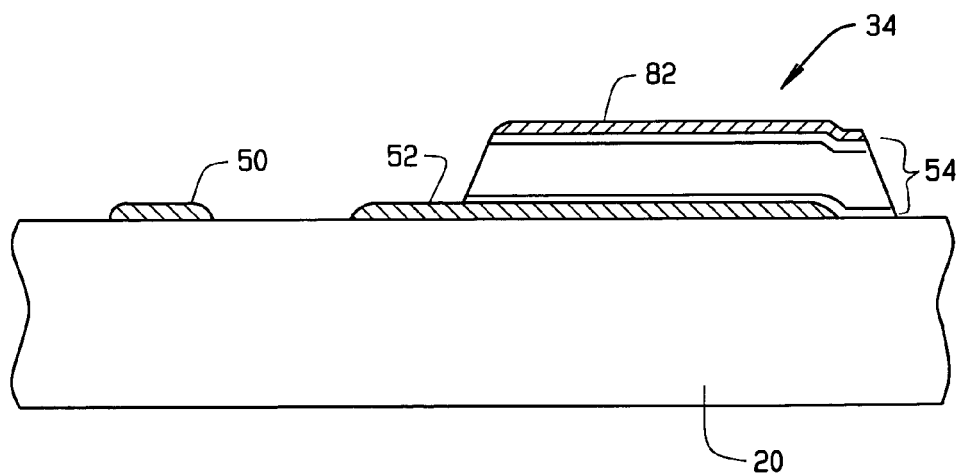
FIG. 6 is a cross-sectional view of a portion of the pixel shown in FIG. 3 during a first subsequent fabrication stage.

FIGS. 5 and 6 are cross-sectional views of a portion of pixel 34 shown in FIG. 3 during an initial fabrication stage and a first subsequent fabrication stage respectively. Semiconductor and dielectric layers are deposited by PECVD. In an exemplary embodiment, a first metallic layer 80 is deposited, patterned, and etched to form gate electrode 50, unitary with scan line 32 (shown in FIG. 2), and diode bottom contact 52. The patterning process includes, but is not limited to, depositing a photoresist, exposing the photoresist in accordance with a desired pattern, and processing photoresist to remove portions thereof, leaving a mask having a selected pattern corresponding to desired dimensions. In one embodiment, first metallic layer 80 is between approximately 100 angstroms (Å) and approximately 4000 Å thick. In another embodiment, first metallic layer 80 is approximately 2000 Å. Alternatively, first metallic layer 80 is between approximately 1000 Å and approximately 3000 Å thick. First metallic layer 80 may include, but is not limited to, aluminum, chromium, silver and/or molybdenum.

Following the gate metal etch, diode stack 54 is deposited on diode bottom contact 52 without any intervening patterning step. In one embodiment, a diode top contact 82 is deposited on diode stack 54. In one embodiment, the diode top contact is formed from a transparent conductor such as indium tin oxide (ITO). Diode stack 54 and diode top contact 82 are patterned and etched. The same mask may be used to first wet etch, or alternatively, dry etch diode top contact 82, followed by a dry etching of diode stack 54. Alternatively, two separate masking steps can be used to form diode top contact 82, smaller than diode stack 54, followed by patterning and etching diode stack 54.

Figure 7:
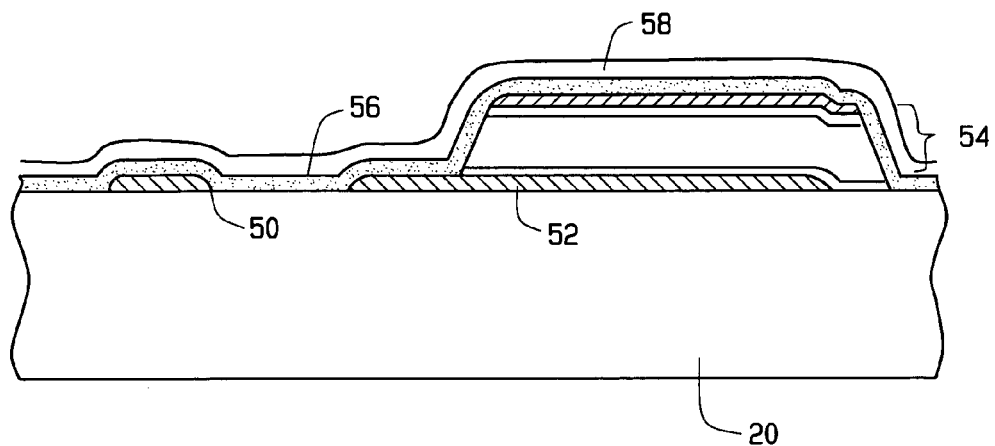
FIG. 7 is a cross-sectional view of a portion of the pixel shown in FIG. 3 during a second subsequent fabrication stage.
Figure 8:
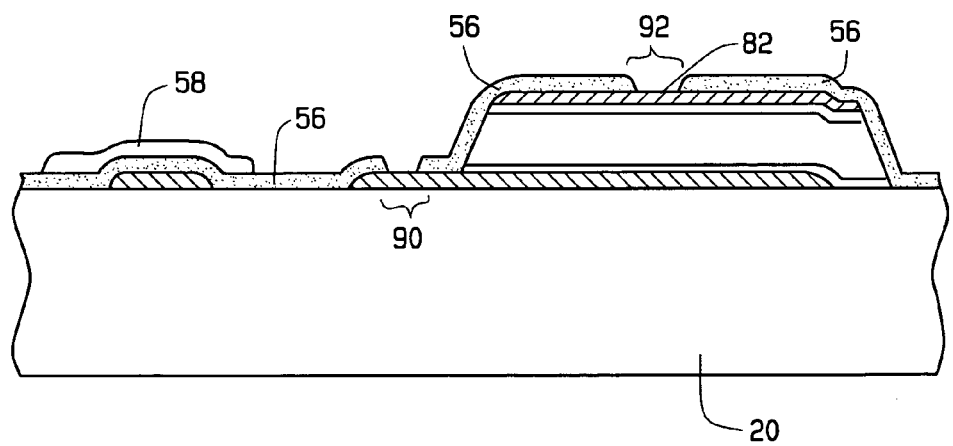
FIG. 8 is a cross-sectional view of a portion of the pixel shown in FIG. 3 during a third subsequent fabrication stage.

FIGS. 7 and 8 are cross-sectional views of a portion of pixel 34 shown in FIG. 3 during an second subsequent fabrication stage and a third subsequent fabrication stage respectively. In the exemplary embodiment, a gate dielectric layer 56 is deposited on gate electrode 50, diode stack 54, and exposed portions of diode bottom contact 52 and substrate 20. In one embodiment dielectric layer 56 is between approximately 25 nanometers (nm) and approximately 1000 nm thick. In another embodiment, dielectric layer 56 is between approximately 150 nm and approximately 1250 nm thick. In a further embodiment, dielectric layer 56 is approximately 250 nm thick. Dielectric layer 56 includes, but is not limited to, silicon nitride ($SiN_x$) and silicon oxide ($SiO_x$).

A semiconductive material layer 58 is deposited on dielectric layer 56. In one embodiment, semiconductive material layer 58 is between approximately 10 nm and approximately 300 nm thick. In another embodiment, semiconductive material layer 58 is approximately 200 nm thick. In a further embodiment, semiconductive material layer 58 is between approximately 30 nm and approximately 70 nm thick. Semiconductive material layer 58 may include, but is not limited to, substantially intrinsic amorphous silicon. Dielectric layer 56 and semiconductive material layer 58 are patterned and etched or co-deposited patterned and etched to expose a diode bottom contact portion 90, and a diode top contact portion 92 if desired.

Figure 9:
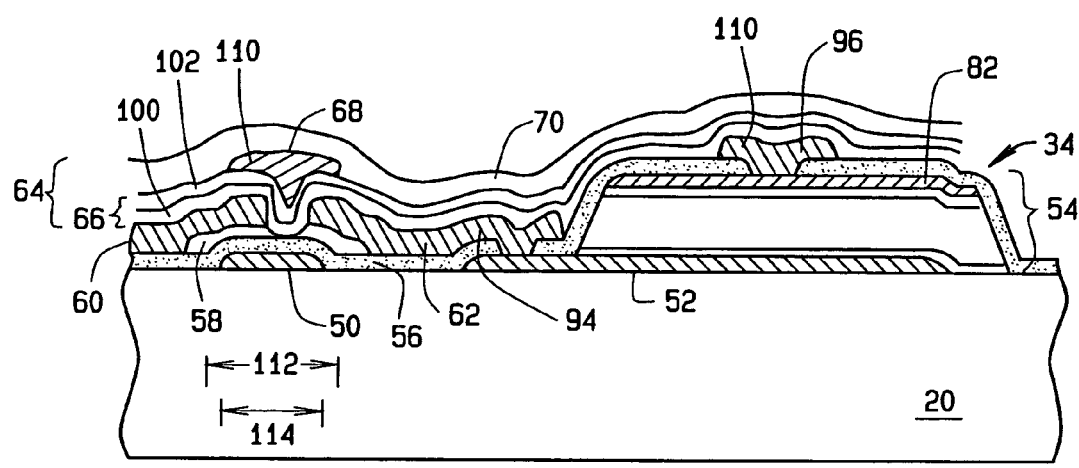
FIG. 9 is a cross-sectional view of a portion of the pixel shown in FIG. 3 during a fourth subsequent fabrication stage.

FIG. 9 is a cross-sectional view of a portion of pixel 34 shown in FIG. 3 during an fourth subsequent fabrication stage. A second metallic layer 94 is deposited on exposed portions of dielectric layer 56, semiconductive material layer 58, and diode bottom contact 52. In one embodiment, second metallic layer 94 is between approximately 50 nm and approximately 1000 nm thick. In another embodiment, second metallic layer 94 is approximately 500 nm thick. In a further embodiment second metallic layer 94 is between approximately 150 nm and approximately 350 nm thick. Second metallic layer 94 may include, but is not limited to, molybdenum, aluminum, and/or chromium. Second metallic layer 94 is patterned and etched to form source electrode 60, and drain electrode 62 unitary with data line 30, and a via 96 to diode top contact 82.

Light transmissive barrier layer 64 including first dielectric barrier 66, light block element 68 and second dielectric barrier 70 is formed on source electrode 60, drain electrode 62, exposed portions of diode bottom contact 52, and diode stack 54. In one embodiment, first dielectric barrier 66 includes a first barrier portion 100 and a second barrier portion 102. First barrier portion 100 is between approximately 20 nm and approximately 50 nm thick. In another embodiment, first barrier portion 100 is approximately 30 nm thick. In a further embodiment, first barrier portion 100 is between approximately 5 nm and approximately 65 nm thick. First barrier portion 100 includes, but is not limited to, SiOx. Second barrier portion 102 is between approximately 200 nm and approximately 700 nm thick. In another embodiment, second barrier portion 102 is approximately 450 nm thick. In a further embodiment, second barrier portion 102 is between approximately 350 nm and approximately 550 nm thick. Second barrier portion 102 includes, but is not limited to, SiN. In one embodiment, second barrier portion 102 is deposited at a temperature between approximately 150° Celsius (C.) and approximately 260° C. In another embodiment, second barrier portion 102 is deposited at a temperature that is approximately 240° C.

A third metallic layer 110 is deposited on first dielectric barrier 66 to form light block element 68 such that light block element 68 is at least coextensive with gate 50. In the exemplary embodiment, light block element 68 is coextensive with gate 50. In use, light block element 68 is formed such that a length 112 of light block element 68 is greater than a length 114 of gate 50 thus covering an exposed portion of gate 50. Light block element 68 is between approximately 50 nm and approximately 200 nm thick. In another embodiment, light block element 68 is approximately 125 nm thick. In a further embodiment, light block element 68 is between approximately 10 nm and approximately 500 nm thick. Light block element 68 can be fabricated from Molybdenum (Mo), amorphous silicon, chromium, tantalum, or Aluminum. In the exemplary embodiment, light block element 68 extends approximately 2 microns (um) or more past the edges of the a-Si where it overlaps gate 50 to facilitate compensating for any misalignment during photolithography on large area substrates and overetch of the Mo. The Mo is then wet etched using standard Mo etchants, such as, but not limited to, Cyantek 12-S which includes nitric and phosphoric acids to which ITO is substantially impervious. A patterning photoresist is then removed by plasma ashing in oxygen or by wet stripping. In the exemplary embodiment, light block element 68 is patterned in the imaging array, not on contact pads or other imager structures outside the array. Forming light block element 68 using Mo facilitates generating a light absorption that is greater than that of an opaque polymer, therefore thinner layers, as described herein, which are easier to work with, can be used.

Second dielectric barrier 70 is then formed on light block element 68 and exposed portions of first dielectric barrier 66. Second dielectric barrier 70 is between approximately 300 nm and approximately 1500 nm thick. In another embodiment, second dielectric barrier 70 is approximately 500 nm thick. In a further embodiment, second dielectric barrier 70 is between approximately 400 nm and approximately 600 nm thick. Second dielectric barrier 70 includes, but is not limited to, silicon nitride (SiNx). Second dielectric barrier 70 is deposited at a temperature between approximately 150° C. and approximately 260° C. In another embodiment, second dielectric barrier 70 is deposited at a temperature that is approximately 240° C. In the exemplary embodiment, the combined thickness of first dielectric barrier 66 and second dielectric barrier 70 is approximately one micron. Further, patterning second dielectric barrier 70 formed on light block element 68 is identical to the patterning that would be done if no light block element 68 had been incorporated into light transmissive barrier 64 because light block element 68 is fully encapsulated within light transmissive barrier 64.

In another exemplary embodiment, there are five distinct metal structures that can be formed when second metallic layer 94 and third metallic layer 110 are deposited. These structures include data line 30, TFT source contact 60, light block element 68, TFT drain contact 62 and a connector to diode bottom contact 52, and common line 40 (shown in FIG. 2). In the exemplary embodiment, data line 30 is greater than approximately 400 nm thick if Mo is used. TFT source contact 60, TFT drain contact 62, and common line 40 are greater than approximately 100 nm thick if Mo is used, and light block element 68 has the same thicknesses as described herein. The thickness of dataline 30, TFT source contact 60, TFT drain contact 62, and light block element 68 are chosen based on a plurality of imager resistance requirements and a process robustness. In one embodiment, data line 30 is between approximately 600 nm and 1500 nm thick. In another embodiment, data line 30 is approximately 1000 nm thick.

For example, source 60, drain 62, and light block element 68 can deposited in second metallization 94 or third metallization 110. In the exemplary embodiment, second metallization 94 forms TFT source contact 60, and TFT drain contact 62, but not light block element 68 which would cause TFT source contact 60 and TFT drain contact 62 to electrically short. In one embodiment, data line 30 is not formed at the same time as source 60, i.e. data line side, and a via (not shown) is formed within the first portion of the barrier 66 to allow data line 30 to electrically connect to the TFT before deposition of third metallic layer 110. If the via is formed, first barrier portion 100 is between approximately 100 nm and approximately 300 nm thick. In an exemplary embodiment, first barrier portion 100 is approximately 200 nm thick. In one embodiment, second barrier portion 102 is between approximately 700 nm and approximately 900 nm thick. In an exemplary embodiment, second barrier portion 102 is approximately 800 nm thick.

Table 1 illustrates a plurality of embodiments, prior to depositing second dielectric barrier 70, as combinations of structures that can be formed when depositing second metallic layer 94 and third metallic layer 110, and illustrates when common/diode top via 96 and a data source via 120 and can be formed in first barrier portion 100.

| Embodiment | Data Line | Source | Light Block | Drain | Common Line | Data-Source Via | Common-Diode Top Via |
|---|---|---|---|---|---|---|---|
| A | 2nd | 2nd | 3rd | 2nd | 2nd | No | No |
| B | 3rd | 2nd | 3rd | 2nd | 2nd | Yes | No |

-continued

| Embodiment | Data Line | Source | Light Block | Drain | Common Line | Data-Source Via | Common-Diode Top Via |
|---|---|---|---|---|---|---|---|
| C | 3rd | 2nd | 3rd | 2nd | 3rd | Yes | Yes |
| D | 2nd | 2nd | 3rd | 2nd | 3rd | No | Yes |

Figure 10:
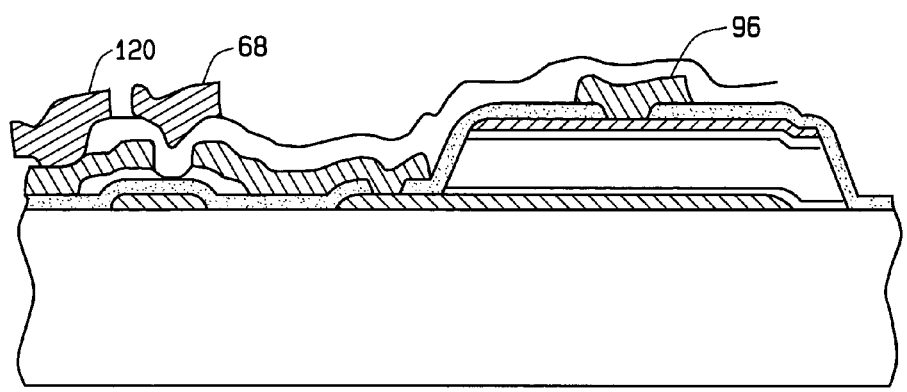
FIG. 10 is a cross-sectional view of a portion of a pixel of a radiation detector described in embodiment B.
Figure 11:
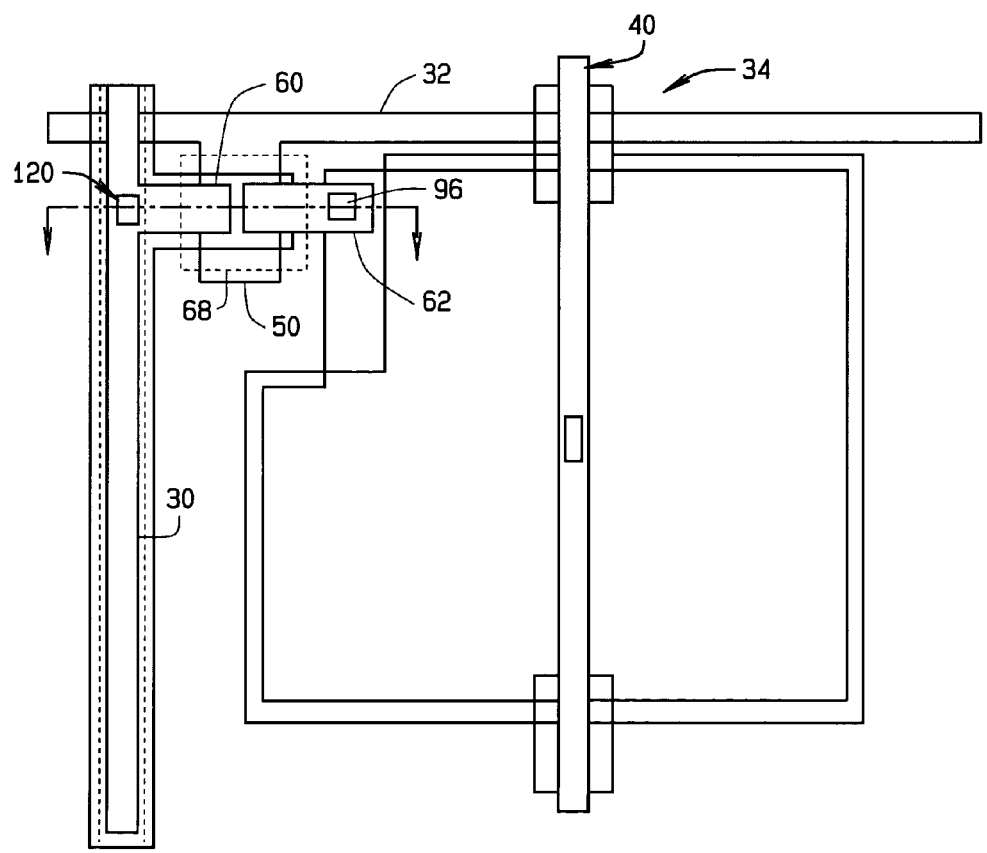
FIG. 11 is a top view of a portion of the pixel shown in FIG. 10.

As illustrated, Embodiment A has been described herein in FIG. 9. FIG. 10 is a cross-sectional view of a portion of a pixel of a radiation detector described in embodiment B. FIG. 11 is a top view of a portion of the pixel shown in FIG. 10. As shown, Embodiment B facilitates reducing a dataline resistance using a thick data line metal and allows separate patterning of source 60 and drain 62 from data line 30, for example for a large imager used in fluoroscopy mode. As shown in Embodiment B, source 60, drain 62, and common line 40, formed from the same metal can be approximately 100 nm thick.

Figure 12:
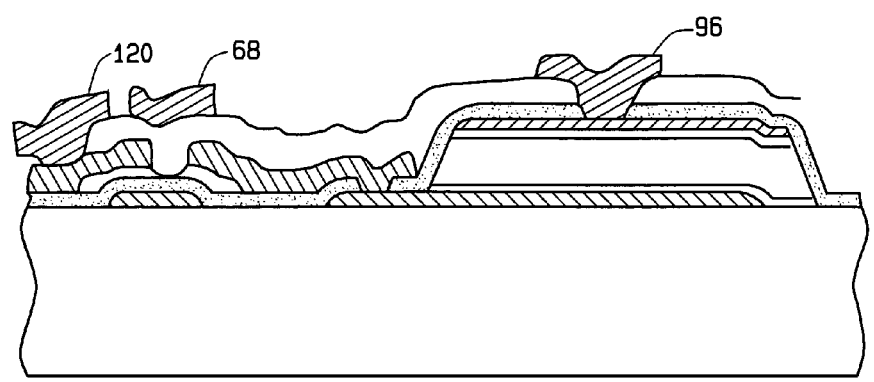
FIG. 12 is a cross-sectional view of a portion of a pixel of a radiation detector described in embodiment C.
Figure 13:
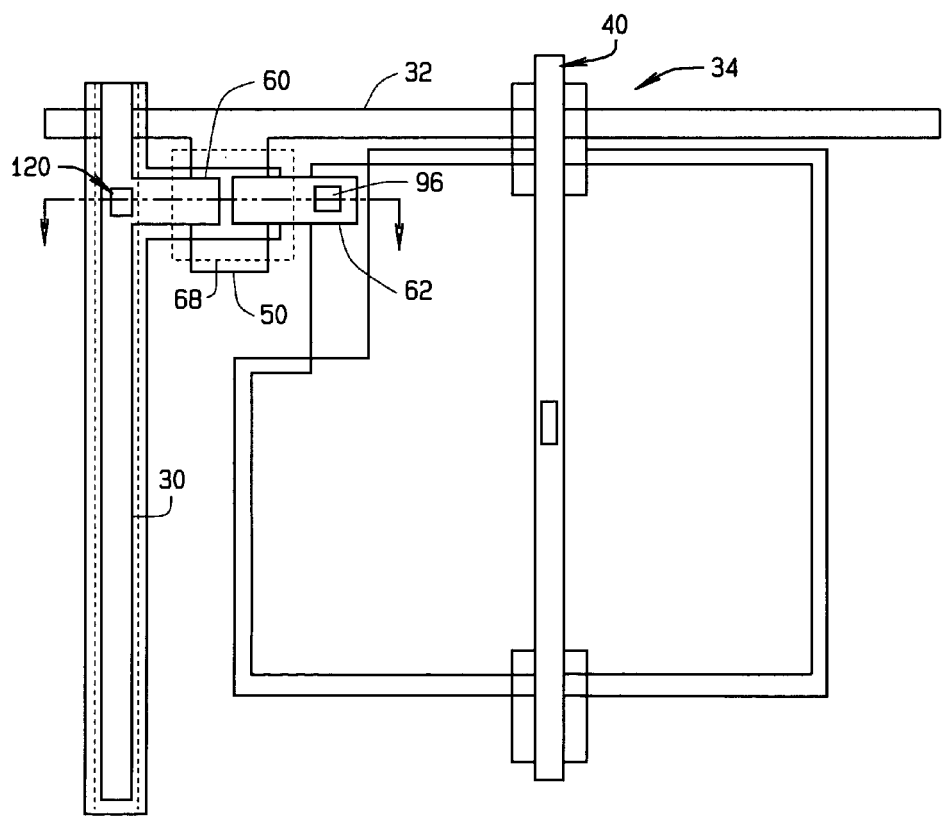
FIG. 13 is a top view of a portion of the pixel shown in FIG. 10.
Figure 14:
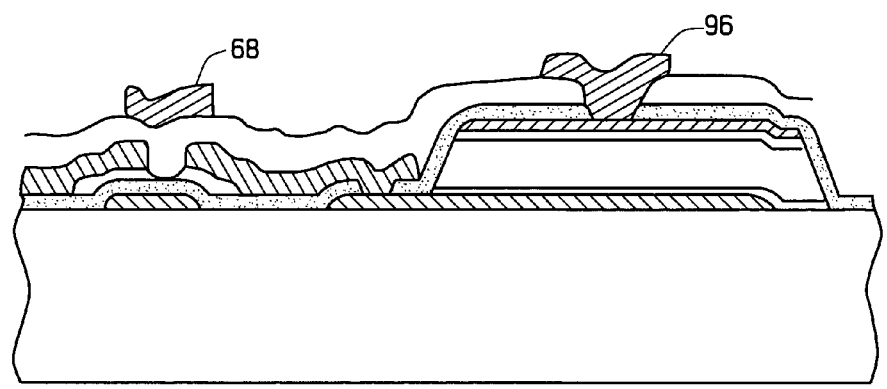
FIG. 14 is a cross-sectional view of a portion of a pixel of a radiation detector described in embodiment D.
Figure 15:
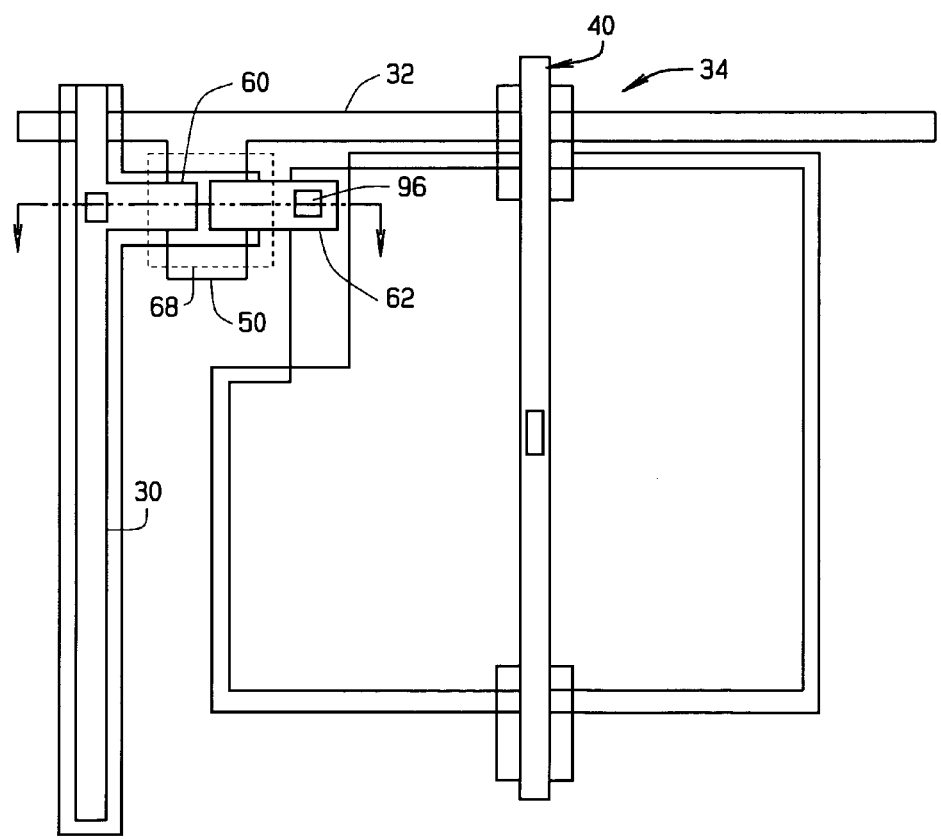
FIG. 15 is a top view of a portion of the pixel shown in FIG. 10.

FIG. 12 is a cross-sectional view of a portion of a pixel of a radiation detector described in embodiment C. FIG. 13 is a top view of a portion of the pixel shown in FIG. 12. FIG. 14 is a cross-sectional view of a portion of a pixel of a radiation detector described in embodiment D. FIG. 15 is a top view of a portion of the pixel shown in FIG. 14. In another exemplary embodiment, light block element 68 can be connected to common line 40 in embodiments C and D, and light block element 68 can be connected to data line 30 in embodiments B and C, but light block element 68 is not connected to both common line 40 and dataline 30 in embodiment C. Embodiments B, C, and D facilitate ensuring that light block element 68 does not electrically float.

As described herein, a reduced mask set imager process includes forming gate 50, scan lines 32, and photodiode bottom contact pads 52, and then photodiode 54 and the thin film transistors. Finally, a light transmissive barrier layer 64 including first dielectric barrier 66, light block element 68 and second dielectric barrier 70 is formed on source electrode 60, drain electrode 62, exposed portions of diode bottom contact 52, and diode stack 54. This light transmissive barrier layer 64 facilitates protecting the underlying structures from ambient light and is the layer upon which the scintillator is disposed if an x-ray imager if formed.

While the invention has been described in terms of various specific embodiments, those skilled in the art will recognize that the invention can be practiced with modification within the spirit and scope of the claims.

What is claimed is:

1. An imaging array comprising:
a photodiode comprising a diode stack, a gate dielectric layer formed on said diode stack, a diode bottom contact, and a substrate; and
a light transmissive barrier layer formed on said gate dielectric layer, said light transmissive barrier layer comprising a first dielectric barrier; a light block element formed on the first dielectric barrier, wherein said light block element is at least coextensive with a gate electrode; and a second dielectric barrier formed on said first dielectric barrier and said light block element, said light block element is encapsulated between said first dielectric barrier and said second dielectric barrier, and said light block element is directly on said first dielectric barrier.

2. An imaging array in accordance with claim 1 wherein said second dielectric barrier is directly on said light block element.

3. An imaging array in accordance with claim 1 further comprising a scintillator disposed on said light transmissive barrier.

4. An imaging array comprising:
a photodiode comprising a diode stack, a gate dielectric layer formed on said diode stack, a diode bottom contact, and a substrate; and
a light transmissive barrier layer formed on said gate dielectric layer, said light transmissive barrier layer comprising a first dielectric barrier comprising a first barrier portion comprising silicon oxide and a second barrier portion comprising silicon nitride; a light block element formed on said first dielectric barrier, wherein said light block element is at least coextensive with a gate electrode; and a second dielectric barrier between approximately 300 nm and approximately 800 nm thick formed on said first dielectric barrier and said light block element, said light block element is encapsulated between said first dielectric barrier and said second dielectric barrier, and said light block element is formed directly on said first dielectric barrier.

5. A imaging array in accordance with claim 4 further comprising a scintillator disposed on said light transmissive barrier.

6. A medical imaging system comprising:
an x-ray source; and
an x-ray detector operationally coupled to said x-ray source, said x-ray detector comprising: a photodiode comprising a diode stack, a gate dielectric layer formed on said diode stack, a diode bottom contact, and a substrate; and a light transmissive barrier layer formed on said gate dielectric layer,
said light transmissive barrier layer further comprising a first dielectric barrier; a light block element formed on the first dielectric barrier, wherein said light block element is at least coextensive with a gate electrode; and a second dielectric barrier formed on said first dielectric barrier and said light block element, said light block element is encapsulated between said first dielectric barrier and said second dielectric barrier, and said light block element is directly on said first dielectric barrier.

7. A medical imaging system in accordance with claim 6 further comprising a scintillator disposed on said light transmissive barrier.

8. A medical imaging system comprising:
an x-ray source; and
an x-ray detector operationally coupled to said x-ray source, said x-ray detector comprising: a photodiode comprising a diode stack, a gate dielectric layer formed on said diode stack, a diode bottom contact, and a substrate; and a light transmissive barrier layer formed on said gate dielectric layer,
said light transmissive barrier layer further comprising a first dielectric barrier comprising a first barrier portion comprising silicon oxide and a second barrier portion comprising silicon nitride; a light block element formed on said first dielectric barrier, wherein said light block element is at least coextensive with a gate electrode; and a second dielectric barrier between approximately 300 nm and approximately 800 nm thick formed on said first dielectric barrier and said light block element, said light block element is encapsulated between said first dielectric barrier and said second dielectric barrier, and said light block element is directly on said first dielectric barrier.

9. A medical imaging system in accordance with claim 8 further comprising a scintillator disposed on said light transmissive barrier.

* * * * *